United States Patent
Ahsan et al.

(10) Patent No.: US 7,396,694 B2
(45) Date of Patent: Jul. 8, 2008

(54) STRUCTURE FOR MONITORING SEMICONDUCTOR POLYSILICON GATE PROFILE

(75) Inventors: Ishtiaq Ahsan, Wappingers Falls, NY (US); Edward P. Maciejewski, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 11/539,231

(22) Filed: Oct. 6, 2006

(65) Prior Publication Data

US 2007/0087593 A1 Apr. 19, 2007

Related U.S. Application Data

(62) Division of application No. 10/901,870, filed on Jul. 29, 2004, now Pat. No. 7,135,346.

(51) Int. Cl.
H01L 21/66 (2006.01)

(52) U.S. Cl. .................. 438/14; 257/E21.521

(58) Field of Classification Search ............ 438/14–18; 257/E21.529
See application file for complete search history.

(56) References Cited

U.S. PATENT DOCUMENTS

| | | | |
|---|---|---|---|
| 6,232,243 | B1 | 5/2001 | Farnworth et al. |
| 6,583,056 | B2 | 6/2003 | Yu et al. |
| 2001/0007794 | A1 | 7/2001 | Kim et al. |
| 2001/0008448 | A1 | 7/2001 | Thakur et al. |
| 2001/0014495 | A1 | 8/2001 | Yu |
| 2001/0017385 | A1 | 8/2001 | Yamamoto |
| 2001/0017698 | A1 | 8/2001 | Thakur et al. |
| 2001/0018243 | A1 | 8/2001 | Kim et al. |
| 2001/0031538 | A1 | 10/2001 | Dekker et al. |
| 2001/0036700 | A1 | 11/2001 | Wang et al. |
| 2001/0055883 | A1 | 12/2001 | Kawazoe |
| 2002/0001935 | A1 | 1/2002 | Kim et al. |
| 2002/0003622 | A1 | 1/2002 | Thakur et al. |
| 2002/0016044 | A1 | 2/2002 | Dreybrodt et al. |
| 2002/0055212 | A1 | 5/2002 | Choi et al. |
| 2002/0055226 | A1 | 5/2002 | Liu et al. |
| 2002/0067489 | A1 | 6/2002 | Thakur et al. |
| 2002/0068387 | A1 | 6/2002 | Tran |
| 2002/0076866 | A1 | 6/2002 | Cherng et al. |
| 2002/0076877 | A1 | 6/2002 | Gupta et al. |
| 2002/0089011 | A1 | 7/2002 | Mirabel |
| 2002/0093414 | A1 | 7/2002 | Wong et al. |
| 2002/0115273 | A1 | 8/2002 | Chandra et al. |
| 2002/0130373 | A1 | 9/2002 | Ueno et al. |
| 2002/0145174 | A1 | 10/2002 | Aipperspach et al. |
| 2002/0170487 | A1 | 11/2002 | Zehavi et al. |
| 2002/0179967 | A1 | 12/2002 | Fujishima |
| 2002/0197787 | A1 | 12/2002 | Tran |
| 2003/0003686 | A1 | 1/2003 | Boyle et al. |
| 2003/0017659 | A1 | 1/2003 | Takei et al. |
| 2003/0017677 | A1 | 1/2003 | Yu et al. |

(Continued)

*Primary Examiner*—Thao X. Le
*Assistant Examiner*—Elias Ullah
(74) *Attorney, Agent, or Firm*—Lisa U. Jaklitsch (57) ABSTRACT

Detection of a profile drift of a polysilicon line is enhanced by a test structure that (1) measures a bottom width and an average width of a cross sectional area of the same polysilicon line (2) correlates the two measurements, and (3) compares such correlation with a previous correlation of bottom width to average width of cross sectional area of the same polysilicon line.

5 Claims, 5 Drawing Sheets

U.S. PATENT DOCUMENTS

| | | |
|---|---|---|
| 2003/0017684 A1 | 1/2003 | Dreybrodt et al. |
| 2003/0045118 A1 | 3/2003 | Wu et al. |
| 2003/0049872 A1 | 3/2003 | Look et al. |
| 2003/0049905 A1 | 3/2003 | Nitta et al. |
| 2003/0062566 A1 | 4/2003 | Schuegraf et al. |
| 2003/0068898 A1 | 4/2003 | Lee et al. |
| 2003/0133661 A1 | 7/2003 | Adibi et al. |
| 2003/0150378 A1 | 8/2003 | Winterton et al. |
| 2003/0157755 A1 | 8/2003 | Kitazawa et al. |
| 2003/0181047 A1 | 9/2003 | Chang |
| 2003/0189253 A1 | 10/2003 | Schuegraf et al. |
| 2003/0224570 A1 | 12/2003 | Shih |
| 2004/0002189 A1 | 1/2004 | Park |
| 2004/0005743 A1 | 1/2004 | Okumura et al. |
| 2004/0015802 A1 | 1/2004 | Cloudman et al. |
| 2004/0018649 A1 | 1/2004 | Shih et al. |
| 2004/0018679 A1 | 1/2004 | Yu et al. |
| 2004/0029389 A1 | 2/2004 | Lo |
| 2004/0037134 A1 | 2/2004 | Tran |
| 2004/0038476 A1 | 2/2004 | Tran |
| 2004/0043549 A1 | 3/2004 | Sayama et al. |
| 2004/0056315 A1 | 3/2004 | Ueno et al. |

STRUCTURE FOR MONITORING SEMICONDUCTOR POLYSILICON GATE PROFILE

CROSS REFERENCE TO RELATED PATENT APPLICATIONS

This patent application is a divisional of U.S. patent application Ser. No. 10/901,870 filed on Jul. 29, 2004 now U.S. Pat. No. 7,135,346.

FIELD OF THE INVENTION

The present invention relates generally to semiconductor wafers, and more particularly to polysilicon lines on such semiconductor wafers.

BACKGROUND OF THE INVENTION

A semiconductor wafer typically comprises a plurality of polysilicon ("PC") lines, which transport electrical signals. A cross sectional view taken from the top down of the PC line is known as the profile of the PC line. PC lines have a specific profile in a stable production line. An ideal PC profile is rectangular. Over time, however, the ideal, rectangular profile may drift or, in other words, change. For instance, a PC profile which began as rectangular may drift to trapezoidal in shape. Such drift is known as profile drift. Profile drift may be caused by any number of factors. For example, a machine failure in the wafer fabrication plant or a change in process conditions, such as a change in the Reactive Ion Etching ("RIE") of the PC line, may cause profile drift.

There is one known technique for identification of profile drift in a PC line, namely visual detection. First, a semiconductor wafer comprising a plurality of PC lines is cut. In so doing, the cross sectional area of the PC line is revealed. Second, a photograph of the revealed cross sectional area of the PC line is taken. With the aid of a scanning electron microscope, a technician studies the photograph of the cross sectional area of the PC line. The photograph depicts the PC profile in the production line on a particular date. The technician notes the shape of the PC profile. A technician completes the same exercise on a later date. If the shape changes, the technician identifies a profile drift.

Visual detection has its drawbacks. Visual detection is a destructive technique. Once the wafer has been cut for visual inspection, the wafer cannot be further processed. Accordingly, visual detection wastes the resource of the wafer as well as needlessly consumes the time of the machines that created the destroyed wafer. In addition, visual inspection is time consuming for the technician. Accordingly, the technician does not visually detect each lot or even each bunch of lots. A technician randomly selects one wafer from one lot. Such lot is one lot out of hundreds of wafers and tens of lots. Because visual detection occurs with so few wafers, statistics cannot accurately be gathered regarding the profile drift of a given lot or even a given bunch of lots. Finally, visual detection is only as accurate as the visual faculties of the technician conducting the visual detection.

Therefore, there remains a need in the art for a structure and method of identifying profile drift of a PC line. Specifically, there is a need in the art for a standardized, nondestructive, statistically significant method for identifying profile drift.

These and other deficiencies in the prior art are overcome through the method of this invention.

SUMMARY OF THE INVENTION

The present invention is directed to a test structure and method that identifies a profile drift of a polysilicon line. The method comprises the step of correlating a bottom width to an average width of a cross sectional area of an instant polysilicon line. The method comprises the further step of comparing the correlation with a predetermined correlation of bottom width to average width of the cross sectional area of the polysilicon line. Finally, the method comprises identifying a profile drift whenever the instant correlation does not substantially equal the predetermined correlation.

The present invention is efficient because during manufacturing it detects profile drift in semiconductor wafers in a nondestructive manner that facilitates the generation of profile drift statistics for entire batches of semiconductor wafers. The present invention saves significant costs because the semiconductor wafer is not destroyed or compromised, but instead remains completely intact both during and after testing. In addition, the present invention accurately tests profile drift without requiring a skilled technician to laboriously evaluate individual wafer cross sections under a scanning electron microscope. The present invention facilitates the regular testing of profile drift on a scale much larger than previously possible, which in turn facilitates the generation of a profile drift statistical database with respect to entire lots of semiconductor wafers. The profile drift statistical database streamlines semiconductor wafer fabrication because profile drift can be detected and then corrected much earlier in the semiconductor wafer fabrication process than previously possible.

BRIEF DESCRIPTION OF THE DRAWINGS

The features and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention.

Figure 3:
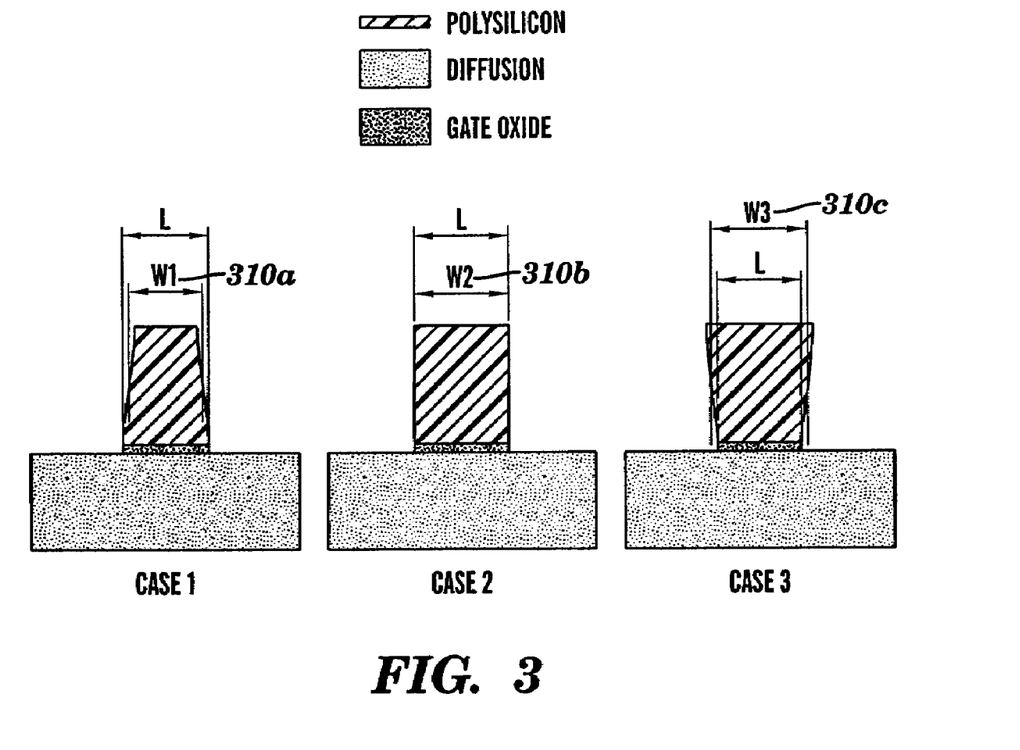
FIG. 3 illustrates three common PC profiles.
Figure 4:
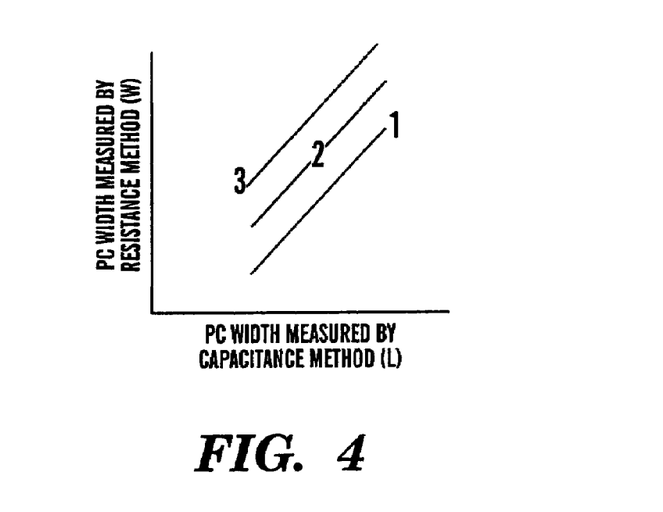
FIG. 4 illustrates the relationship of the bottom width of PC line measured with the capacitive method illustrated in FIG. 1 versus the average width of the cross sectional area of the PC line measured with the resistance method illustrated in FIG. 2 for each of the three types of PC profiles depicted in FIG. 3.

The present invention tests for profile drift during manufacturing in a manner that is non-destructive to the semiconductor wafer. The present invention determines profile drift by comparing PC profiles of the same PC line over time. As PC profile relates to the present invention, a PC profile is described by two measurements, namely a bottom width of a PC line measurement and an average width of a cross sectional area of a PC line measurement. The bottom width of a PC line is directly proportional to the average width of a cross sectional area of a PC line. FIG. 3, which will be described below in further detail, depicts common PC profiles. FIG. 4, also described further below, graphically depicts the proportional relationship of bottom width to average width of a cross sectional area of a PC line.

Figure 1:
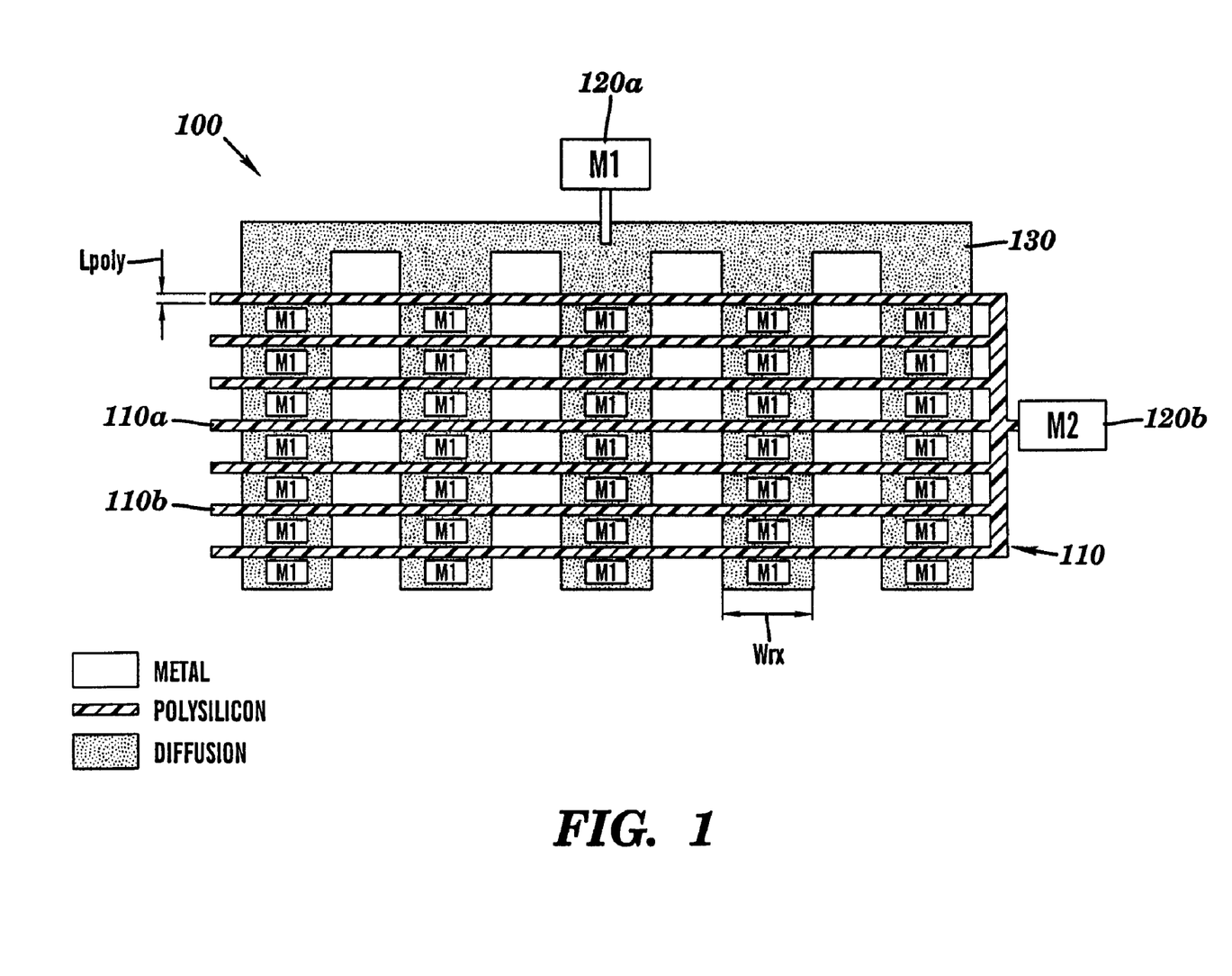
FIG. 1 illustrates a known capacitive test structure that as used in the present invention facilitates a bottom width of a PC line measurement that is used in conjunction with an average width of a cross sectional area measurement to determine profile drift.
Figure 2:
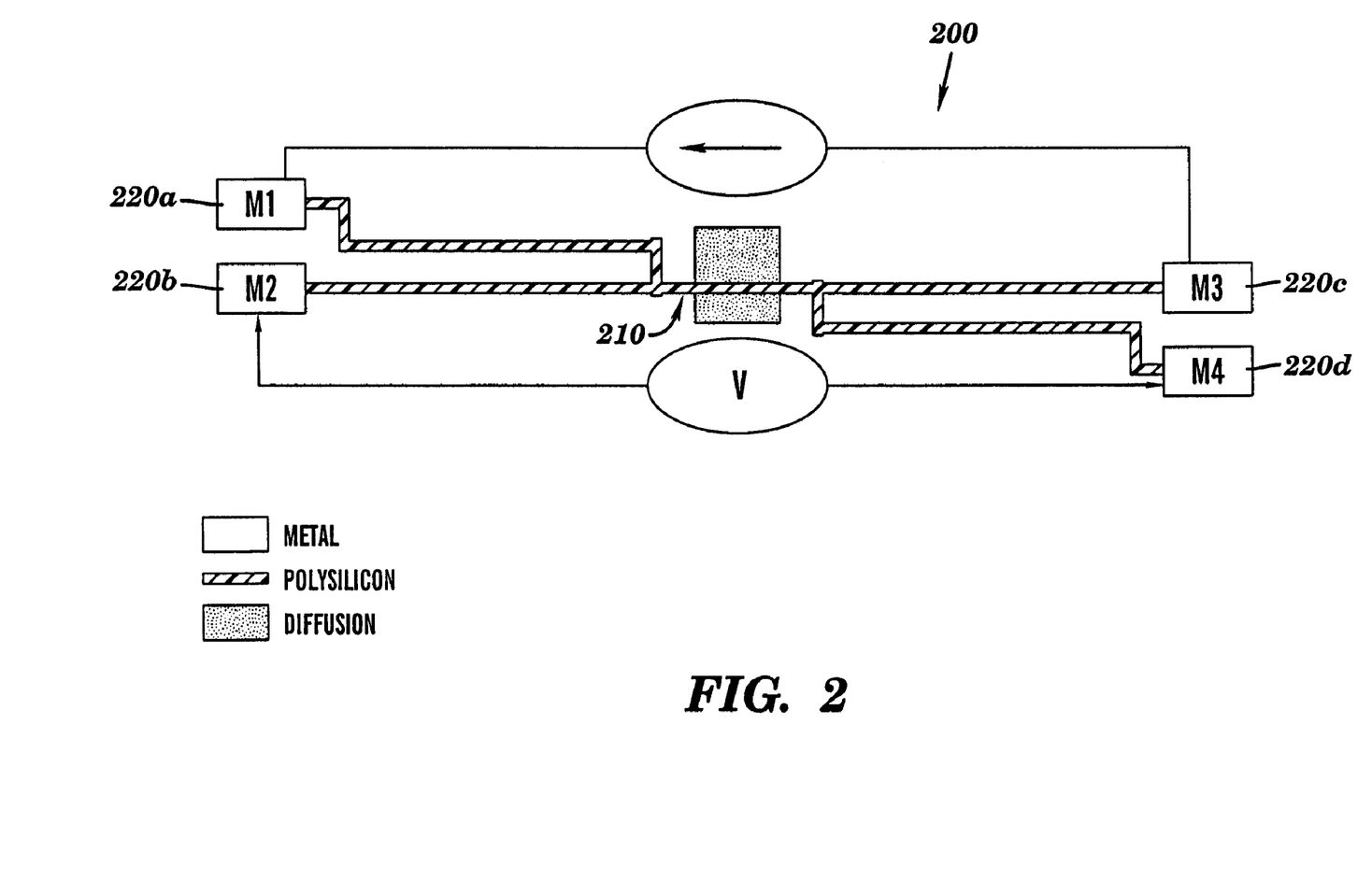
FIG. 2 illustrates a known resistive test structure that as used in the present invention facilitates an average width of a cross sectional area of a PC line measurement that is used in conjunction with a bottom width of a cross sectional area of to determine profile drift.

The present invention determines the bottom width of a PC line and the average width of the cross sectional area of a PC line through the use of two known tests, namely a capacitance test and a resistance test. The capacitance test determines the bottom width of a PC line, while the resistance test determines an average width of a cross sectional area of a PC line. A discussion of both the known capacitance and resistance tests will follow. The known capacitance test is depicted in FIG. 1, while the known resistance test is depicted in FIG. 2.

Prior to the present invention, it was not known that profile drift could be identified by measuring the capacitance of a PC line to calculate the bottom width of a PC line and by measuring the resistance of a PC line to calculate an average width of the cross sectional area of a PC line. Both the known capacitance and resistance tests will be described in more detail below, however first common PC profiles will be described with continued reference to FIG. 3.

A semiconductor wafer comprises at least one PC line in a PC line array that runs over at least one silicon bed in a silicon bed array. Gate oxide separates the PC line from the silicon bed. FIG. 3 depicts a cross sectional area of a PC line, i.e., the PC profile. In FIG. 3, the PC line is represented by the shade labeled polysilicon, while the silicon is represented by the shade labeled polysilicon. As mentioned above, gate oxide separates the PC line from the silicon and is represented by the shade labeled gate oxide in FIG. 3. As seen in FIG. 3, gate oxide separates the PC line (polysilicon shade) from the silicon (diffusion shade).

FIG. 3 depicts three common PC profiles. As discussed above, a PC profile can be described by two measurements, namely a bottom width of a PC line measurement and an average width of a cross sectional area measurement. In FIG. 3, a bottom width of a PC line measurement is represented by the line L, while an average width of the cross sectional area of the PC line is represented by the lines W1, W2, and W3 for cases 1, 2, and 3 respectively (310a, 310b, and 310c).

Case 2 in FIG. 3 represents an ideal PC profile because the PC profile is rectangular. With an ideal, i.e., rectangular, PC profile, the bottom width of the PC line, L, equals the average width of the cross sectional area of the PC profile, W2. Notice that for case 2, the line that indicates the bottom width of the PC line, L, overlaps the line that indicates the average width of the cross sectional area of the PC profile, W2. PC profile is not always ideal, however, as demonstrated by cases 1 and 3 in FIG. 3. For both cases 1 and 3, the PC profile shape is not rectangular, but instead trapezoidal.

In case 1, the width of the PC profile is wider at the bottom than at the top of the PC profile. Because the bottom width is wider than the top width, the bottom width will not equal the average width of the cross sectional area. Such is shown in case 1, because the line that indicates the bottom width of the PC profile, L, does not overlap the line that indicates the average width of the cross sectional area of the PC profile, W1. Instead, the length of line that indicates the bottom width of the PC profile, L, is longer than the length of line that indicates the average width of the PC profile, W1. Second,.

Similar to case 1, case 3 in FIG. 3 represents a non-ideal, trapezoidal, PC profile. In case 3, the width of the PC profile is wider at the top than at the bottom of the PC profile. Because the top width is wider than the bottom width, the bottom width will not equal the average width of the cross sectional area. In case 3 as in case 1, the line that indicates the bottom width of the PC profile, L, does not overlap the line that indicates the average width of the cross sectional area of the PC profile, W3. In case 3, however the length of the line that indicates the bottom width of the PC profile, L, is shorter than the length of the line that indicates the average width of the cross sectional area, W3.

While FIG. 3 represents common PC profiles, cases 1-3 in FIG. 3 can also demonstrate how the profile of PC line could change, i.e., drift over time. For example, if the PC line begins with an ideal, i.e., rectangular, PC shape as shown in case 2, but with time drifts to a non-ideal, i.e., trapezoidal, PC shape as shown in cases 1 and 3, a profile drift has occurred. Similarly, if the PC line begins with a trapezoidal PC shape as shown in case 1, but with time drifts to a trapezoidal PC shape as shown in case 3, a profile drift has occurred. A profile drift is any change in the shape of PC profile over time.

Profile drift is recognized by comparing a predetermined and an instant correlation of bottom width of a PC line versus average width of a cross sectional area of a PC line. If the PC line began with an ideal PC shape as shown in case 2, but with time drifted to a non-ideal PC shape as shown in case 1, the predetermined correlation would correlate the bottom width to the average width of the cross sectional area of the ideal PC shape in case 2 while the instant correlation would correlate the bottom width to the average width of the cross sectional of the non-ideal PC shape in case 1. In such case, the predetermined correlation of bottom width to average width of the cross sectional area would be equal, while the instant correlation of bottom width to average width would be unequal. Similarly, if the PC line begins with a trapezoidal PC shape as shown in case 1, but with time drifts to a trapezoidal PC shape as shown in case 3, the predetermined correlation would correlate the bottom width to the average width of the cross sectional area of the non-ideal PC shape in case 1 while the instant correlation would correlate the bottom width to the average width of the cross sectional of the ideal PC shape in case 2. It should be understood that the PC profiles illustrated in FIG. 3 are for illustrative purposes only and other types of PC profiles exist. The present invention detects profile drift with all types of PC profiles. FIG. 4, a discussion of which follows, depicts the relationship between bottom width versus average width of a cross sectional area for the PC profiles depicted in FIG. 3.

FIG. 4 depicts the proportional relationship of bottom width to average width of a cross sectional area of a PC line to identify profile drift for the PC profiles depicted in FIG. 3. With an ideal, i.e. rectangular, PC profile, as mentioned above, the bottom width of the PC line equals the average width of the PC line. FIG. 4 depicts such relationship with the center line labeled 2. With a non-ideal PC profile, the line that represents the relationship of bottom width versus average width shifts either above or below the center line. For example, the line that is labeled 3 shifts above the center line, while the line that is labeled 1 shifts below the center line. The line that is labeled 3 represents the relationship of bottom width versus average width of the cross sectional area of a PC line for case 3 in FIG. 3, while the line that is labeled 1 represents the relationship of bottom width versus average width of the cross sectional area for case 1 in FIG. 3. FIGS. 1 and 2, a discussion of which follows, respectively illustrate the capacitance test structure used to determine the bottom width of the PC line measurement and the resistance test structure used to determine the value of the average width of the PC line measurement.

Referring now to FIG. 1, FIG. 1 illustrates the known capacitive test structure 100 for measuring the bottom width of a PC line. In FIG. 1, Lpoly represents the bottom width of the PC line. The capacitive test structure of FIG. 1 measures the capacitance of the PC line that runs over the silicon. The measured capacitance of the PC line that runs over the silicon is known as $C_{line}$. As mentioned with reference to FIG. 3, gate oxide separates the PC line from the silicon, accordingly, the normalized capacitance of the PC line separated from the silicon by gate oxide is known as $C_{gate}$. The bottom width of the PC line, Lpoly, is a function of the normalized capacitance of the PC line, $C_{gate}$, which in turn, is a function of the measured capacitance of the PC line, $C_{line}$.

In accordance with the capacitive test structure of FIG. 1, metal pads 120a,b are attached to the array of silicon beds 130 and the PC array 110 respectively. Metal studs labeled "M1" are placed in between the PC lines on the silicon bed. Such studs are connected together and to the metal pad 120a. The capacitance between metal pad 120a, and 120b is then measured, which is the capacitance between the PC line that runs over the silicon and the silicon, $C_{line}$.

Each PC line 110a,b in the PC array 110 is drawn with equal widths. Therefore, if the capacitance between a PC line over the silicon and the silicon is measured, $C_{line}$, and further if the total width and number of the silicon beds, $W_{rx}$ and $N_{rx}$ respectively, and the total number of the PC lines, $N_{line}$, is known, the normalized capacitance of the PC lines separated from the silicon by gate oxide, $C_{gate}$, can be calculated according to the following formula:

$$C_{gate} = (C_{line})/(N_{line} * N_{rx} * W_{rx})$$ Eq. 1

$C_{gate}$=Normalized Capacitance of the PC lines 110a,b separated from the silicon beds 130 by gate oxide (normalized by number of PC lines and total length of the PC lines)

$N_{line}$=Number of PC lines over silicon beds in the PC array (110)

$N_{rx}$=Number of silicon beds (130)

$W_{rx}$=Design width of silicon beds.

$C_{line}$=Measured Capacitance of PC line 110a

As mentioned above, the bottom width of a PC line, Lpoly, is a function is a function of the normalized capacitance of the PC line, $C_{gate}$, which in turn, is a function of the measured capacitance of the PC line, $C_{line}$. Lpoly is further a function of plate capacitance, $C_{plate\_per\_area}$. Plate capacitors are large compared to PC lines (100). Accordingly, their on-wafer dimensions are more immune to process variations and hence plate capacitor area is known with accuracy. $C_{plate\_per\_area}$ is calculated according to the following formula:

$$C_{plate\_per\_area} = C_{plate}/A$$ Eq. 2

$C_{plate}$=Capacitance of the Plate Capacitor
A=Area of the Plate Capacitor

Once both the $C_{gate}$ and $C_{plate\_per\_area}$ have been calculated, the bottom width of a PC line can be calculated according to the following formula:

$$Lpoly = C_{gate}/C_{plate\_per\_area}$$ Eq. 3

FIG. 2 illustrates the known resistive test structure 200 for measuring the average width of a cross sectional area of a PC line 210. The average width of a cross sectional area of a PC line, Wpc, is a function of the resistance of the PC line, $R_{PC}$. To solve for the resistance of the PC line, $R_{PC}$, current, I, is forced through the PC line 210 between metal pads 220a, 220c and the voltage, V, between the metal pads 220b, 220d is measured. The resistance of the PC line, $R_{PC}$ is calculated according to the following formula:

$$R_{PC} = V/I$$ Eq. 4

Because both voltage, V, and current, I, are known, equation 4 can be solved for the resistance of the PC line, $R_{PC}$. As mentioned above the average width of a cross sectional area of a PC line, $W_{pc}$ is a function of the resistance of the PC line, $R_{PC}$. Accordingly, average width of the cross sectional area of a PC line can be calculated according to the following formula:

$$R_{PC} = (P_{pc}/H_{pc}) * (L_{pc}/W_{pc})$$ Eq. 5

Where,
$P_{pc}$=Resistivity of the PC lines
$H_{pc}$=Height of the PC lines
$L_{pc}$=Length of the PC lines
$W_{pc}$=Average Width of the Cross Sectional Area of the PC line Since the length of the PC line, $L_{pc}$ is large, its value is accurately known. Accordingly, normalizing the resistance of a PC line, $R_{PC}$, by the resistivity-to-height ratio of the PC lines $P_{pc}/H_{pc}$ determines the average width of the cross sectional area of the PC lines $W_{pc}$.

In order to determine the resistivity-to-height ratio of the PC lines $P_{pc}/H_{pc}$, use of a large plate resistor is made. It is assumed that the resistivity-to-height ratio of the PC lines $P_{pc}/H_{pc}$ of the PC lines equals the resistivity-to-height ratio $P^*_{pc}/H_{pc}$ of the large plate resistor. The resistivity-to-height ratio $P_{pc}/H_{pc}$ of the large plate resistor can be calculated according to the following formula:

$$R_l = (P_{pc}/H_{pc}) * (L_p/W_p)$$ Eq. 6

$R_l$=total resistance of a PC plate resistor large enough that the length and the width would be known with accuracy
$L_p$=Length of the PC plate resistor (known value)
$W_p$=Width of the PC plate resistor (known value)
$P_{PC}$=Resistivity of PC plate which is assumed to be equal to that of the PC lines (210)
$H_{pc}$=Height of PC plate which is assumed to be equal to that of the PC lines (210)

It can be seen from equation 6 that, by measuring $R_l$, a reasonable value of the resistivity-to-height ratio of the large plate capacitor $P_{pc}/H_{pc}$ can be found. Accordingly, equation 5 can be resolved for the average width of the cross sectional area of the PC line, $W_{pc}$. Because the shape of a PC profile is seldom a perfect rectangle, the width obtained by this methodology is an average width of the cross sectional area of the PC line.

Figure 5:
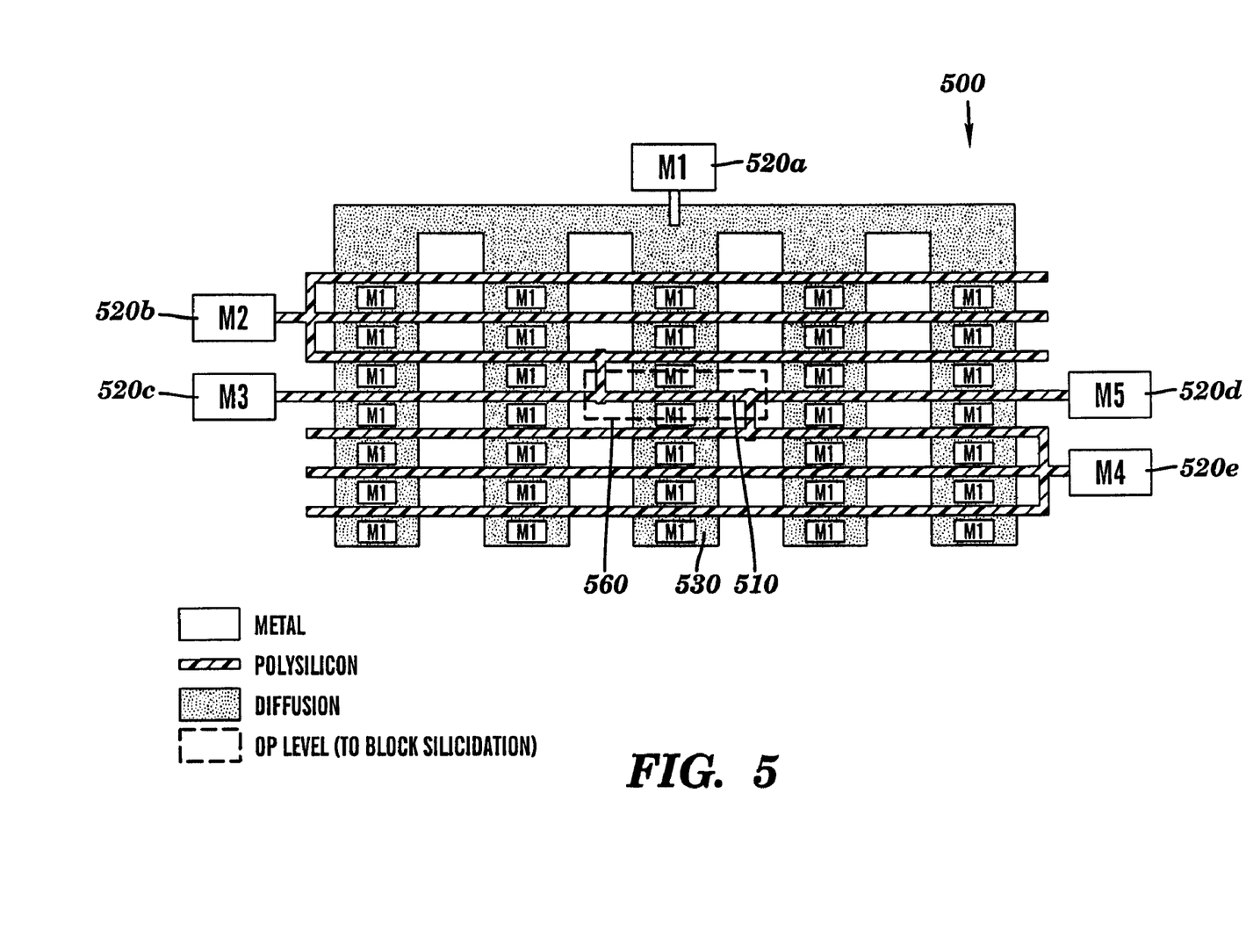
FIG. 5 illustrates the test structure of the present invention.

FIG. 5 illustrates a test structure in accordance with the present invention. The novel test structure 500 simultaneously measures the bottom width of a PC line 510 through a capacitive test and an average width of a PC line through a resistive test. Metal studs labeled "M1" have been placed in between the PC lines on the silicon bed. Such studs are connected together and to the metal pad 120a.

The bottom width of the PC line is measured in accordance with the present invention by shorting metal pads 520b, 520c, 520d, and 520e together. Then the capacitance between metal pad 520a and metal pads 520b, 520c, 520d, and 520e is measured. Such capacitance represents the capacitance between the silicon 530 and the PC line 510 over the silicon 530. As discussed above, the bottom width of a PC line is a function of the normalized capacitance of the PC line.

The average width of the cross sectional area of the PC line is measured in accordance with the present invention by forcing current between metal pads 520*b* and 520*d* and measuring the voltage drop between metal pads 520*c* and 520*e*. At this time, metal pad 520*a* is grounded. The gate oxide insulator ensures that there is a negligible current contribution from pad 520*a* to impact the resistance measurement. Because the length of the PC line in the array 510 is fairly large compared to the width of the PC line, it is more immune to process variations and hence its quantity can be known with accuracy. As discussed above, the average width of a cross sectional area of the PC line is a function of the resistance of the PC line. More specifically, the resistance is a function of the average cross sectional area of the middle section of the middle PC line 510 covered by the OP level (silicide block mask) 560 in FIG. 5. The OP level prohibits silicidation of the PC line so that current flows through the whole cross-sectional area of the PC line in that region.

Figure 6:
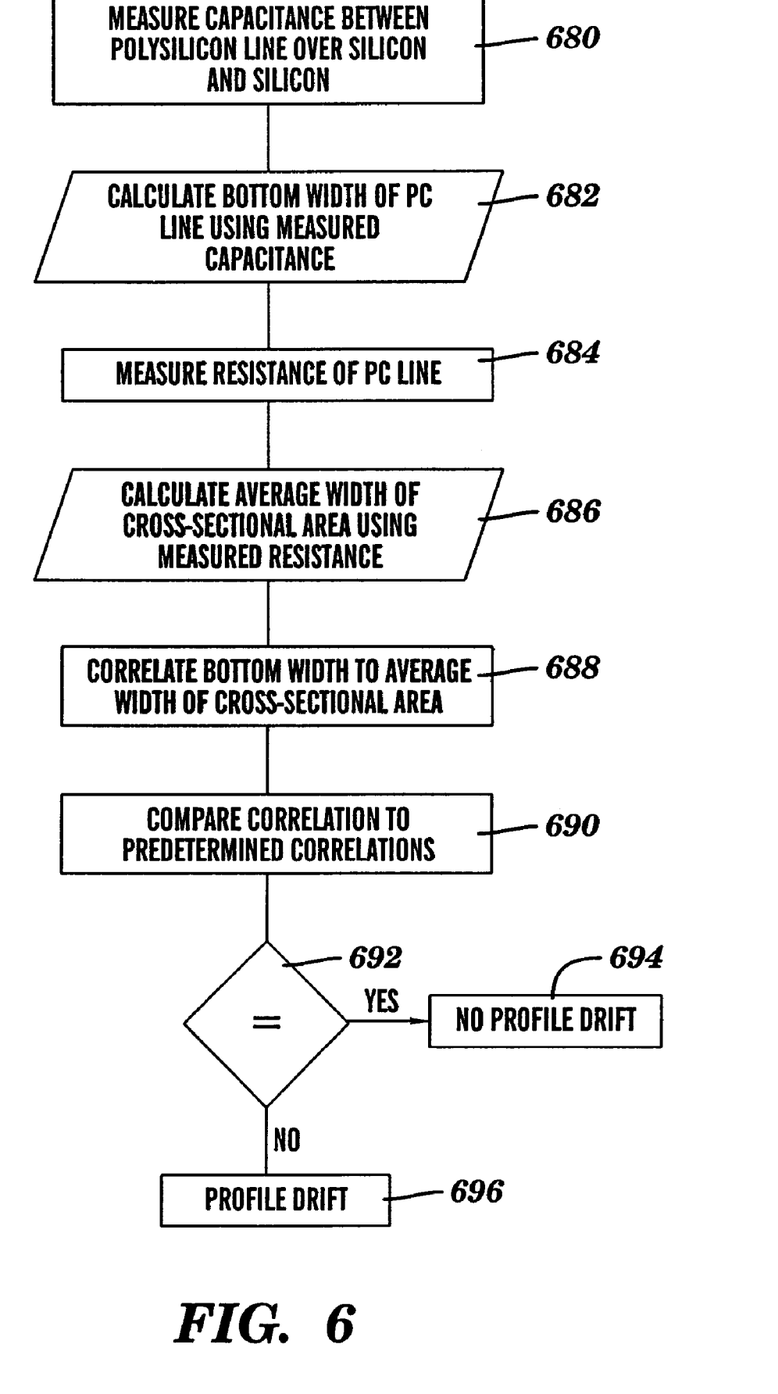
FIG. 6 illustrates the method of the present invention.

FIG. 6 illustrates the method of the present invention. In step 680, the capacitance between a PC line over silicon and silicon is measured. In step 682, the bottom width of the PC line is calculated using the measured capacitance value from step 680. In step 684, the resistance of the PC line is measured. Using the resistance measured in step 684, the average width of the cross sectional area of the polysilicon line is calculated in step 686. Next, the bottom width is correlated with the average width of the cross sectional area in step 688. Such correlation represents the instant or present shape of the PC line. Once correlated, the correlation is compared with a predetermined correlation of bottom width to average width of the cross sectional area in step 690, which represents the previous shape of the PC line. If equal in step 692, no profile drift has occurred (step 694). In other words, the instant shape of the PC line equals the past, i.e. predetermined, shape of the PC line. If unequal in step 692, a profile drift has occurred (step 696) because the instant shape of the PC line does not equal the past, i.e. predetermined, shape of the PC line.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method for identifying a profile drift of a polysilicon line, comprising the steps of:
    (a) correlating a bottom width to an average width of a cross sectional area of an instant polysilicon line;
    (b) comparing said correlation with a predetermined correlation of bottom width to average width of cross sectional area of said polysilicon line; and,
    (c) identifying a profile drift whenever said instant correlation does not substantially equal said predetermined correlation.

2. A method as in claim 1, further comprising, prior to step (a), the step of:
    measuring a capacitance of said polysilicon line.

3. A method as in claim 2, further comprising, prior to step (a), the step of:
    calculating said bottom width of said polysilicon line through use of said measured capacitance.

4. A method as in claim 1, further comprising, prior to step (a), the step of:
    measuring a resistance of said polysilicon line.

5. A method as in claim 4, further comprising, prior to step (a), the step of:
    calculating said average width of said cross sectional area through use of said measured resistance.

\* \* \* \* \*